(12) United States Patent     (10) Patent No.: US 7,466,174 B2
Tirumalai et al.     (45) Date of Patent: Dec. 16, 2008

(54) FAST LOCK SCHEME FOR PHASE LOCKED LOOPS AND DELAY LOCKED LOOPS

(75) Inventors: Sridhar R. Tirumalai, Chandler, AZ (US); Amir Bashir, El Dorado Hills, CA (US); Jing Li, Folsom, CA (US); Andrew M. Volk, Granite Bay, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/396,041

(22) Filed: Mar. 31, 2006

(65) Prior Publication Data

US 2007/0229127 A1     Oct. 4, 2007

(51) Int. Cl.
*H03L 7/06* (2006.01)

(52) U.S. Cl. .................. 327/156; 327/142; 327/147

(58) Field of Classification Search ............ 327/40, 327/42, 124, 142, 141, 144–159, 161–163
See application file for complete search history.

(56) References Cited

U.S. PATENT DOCUMENTS

| | | | |
|---|---|---|---|
| 4,112,490 A | 9/1978 | Pohlman et al. | |
| 4,546,472 A | 10/1985 | Volk et al. | |
| 4,819,081 A | 4/1989 | Volk et al. | |
| 4,829,258 A | 5/1989 | Volk et al. | |
| 5,304,953 A * | 4/1994 | Heim et al. | 331/1 A |
| 5,304,955 A * | 4/1994 | Atriss et al. | 331/1 R |
| 5,332,930 A | 7/1994 | Volk | |
| 5,369,311 A | 11/1994 | Wang et al. | |
| 5,384,502 A | 1/1995 | Volk | |
| 5,388,265 A | 2/1995 | Volk | |
| 5,537,069 A | 7/1996 | Volk | |
| 5,543,734 A | 8/1996 | Volk et al. | |
| 5,572,465 A | 11/1996 | Bashir | |
| 5,594,691 A | 1/1997 | Bashir | |
| 5,615,404 A | 3/1997 | Knoll et al. | |
| 5,621,901 A | 4/1997 | Morriss et al. | |
| 5,670,869 A * | 9/1997 | Weisenbach | 323/313 |
| 5,874,863 A * | 2/1999 | Wojewoda et al. | 331/17 |
| 5,996,027 A | 11/1999 | Volk et al. | |
| 5,999,020 A | 12/1999 | Volk et al. | |
| 6,112,306 A | 8/2000 | Volk et al. | |
| 6,128,359 A | 10/2000 | Volk | |
| 6,128,749 A | 10/2000 | McDonnell et al. | |
| 6,166,563 A | 12/2000 | Volk et al. | |
| 6,191,662 B1 | 2/2001 | Volk | |
| 6,329,882 B1 * | 12/2001 | Fayneh et al. | 331/10 |
| 6,347,850 B1 | 2/2002 | Volk | |
| 6,356,105 B1 | 3/2002 | Volk | |
| 6,369,734 B2 | 4/2002 | Volk | |

(Continued)

*Primary Examiner*—Lincoln Donovan
*Assistant Examiner*—Patrick O'Neill
(74) *Attorney, Agent, or Firm*—Schwegman, Lundberg & Woessner, P.A.

(57) ABSTRACT

A fast lock scheme for phase locked loops and delay locked loops, where apparatus, systems, and methods include a startup circuit that is enabled at the beginning of a startup mode and is disabled upon a phase transition detection in the reference and feedback signals to the phase locked loop or delay locked loop. Further apparatus, systems, and methods enable a first charge pump when a phase transition is detected, and enable a second charge pump when the phase difference between the reference and feedback signals fall within a predetermined range.

28 Claims, 7 Drawing Sheets

U.S. PATENT DOCUMENTS

| | | |
|---|---|---|
| 6,380,758 B1 | 4/2002 | Hsu et al. |
| 6,392,573 B1 | 5/2002 | Volk |
| 6,407,600 B1 * | 6/2002 | Lu et al. .................... 327/156 |
| 6,408,398 B1 | 6/2002 | Freker et al. |
| 6,420,899 B1 | 7/2002 | Crittenden et al. |
| 6,445,316 B1 | 9/2002 | Hsu et al. |
| 6,457,095 B1 | 9/2002 | Volk |
| 6,495,997 B2 | 12/2002 | Hall et al. |
| 6,496,132 B2 | 12/2002 | Volk |
| 6,507,295 B2 | 1/2003 | Volk |
| 6,516,396 B1 | 2/2003 | Volk et al. |
| 6,525,612 B2 * | 2/2003 | Aoki .......................... 331/11 |
| 6,542,013 B1 | 4/2003 | Volk et al. |
| 6,556,022 B2 | 4/2003 | To et al. |
| 6,560,666 B1 | 5/2003 | Harriman et al. |
| 6,570,371 B1 | 5/2003 | Volk |
| 6,604,179 B2 | 8/2003 | Volk et al. |
| 6,606,705 B1 | 8/2003 | Volk |
| 6,611,918 B1 | 8/2003 | Uzelac et al. |
| 6,617,888 B2 | 9/2003 | Volk |
| 6,624,662 B1 | 9/2003 | Volk |
| 6,662,305 B1 | 12/2003 | Salmon et al. |
| 6,664,906 B2 | 12/2003 | Volk |
| 6,667,643 B2 * | 12/2003 | Ko ............................. 327/158 |
| 6,693,450 B1 | 2/2004 | Volk et al. |
| 6,774,735 B2 | 8/2004 | Senthilkumar et al. |
| 6,777,975 B1 | 8/2004 | Dabral et al. |
| 6,791,428 B2 | 9/2004 | Senthilkumar et al. |
| 6,794,919 B1 | 9/2004 | Volk et al. |
| 6,915,399 B1 | 7/2005 | McDonnell et al. |
| 6,919,769 B2 * | 7/2005 | Lim et al. ..................... 331/17 |
| 6,922,047 B2 * | 7/2005 | Knoll et al. ............... 324/76.53 |
| 6,924,692 B2 | 8/2005 | Fulton et al. |
| 6,928,494 B1 | 8/2005 | Volk et al. |
| 6,940,163 B2 | 9/2005 | Piorun et al. |
| 6,957,354 B2 | 10/2005 | Uzelac et al. |
| 6,960,950 B2 | 11/2005 | Shah et al. |
| 6,963,991 B2 | 11/2005 | Hill et al. |
| 6,971,040 B2 | 11/2005 | Volk |
| 7,078,977 B2 * | 7/2006 | Maneatis ..................... 331/16 |
| 7,126,798 B2 | 10/2006 | Piorun et al. |
| 7,157,894 B2 | 1/2007 | Fulton et al. |
| 7,181,631 B2 | 2/2007 | Volk |
| 7,203,853 B2 | 4/2007 | Martwick et al. |
| 7,245,682 B2 | 7/2007 | Hsu et al. |
| 7,262,647 B2 * | 8/2007 | Chou .......................... 327/158 |
| 2004/0268158 A1 | 12/2004 | Fulton et al. |
| 2005/0003764 A1 | 1/2005 | Piorun et al. |
| 2005/0231272 A1 | 10/2005 | Fulton et al. |
| 2006/0005059 A1 | 1/2006 | Uzelac et al. |
| 2006/0133469 A1 | 6/2006 | Froelich et al. |
| 2006/0179372 A1 | 8/2006 | Volk |

\* cited by examiner

FAST LOCK SCHEME FOR PHASE LOCKED LOOPS AND DELAY LOCKED LOOPS

FIELD

Embodiments of the present invention relate to circuits, and more particularly, to phase locked loops and delay locked loops.

BACKGROUND

Phase locked loops and delay locked loops find wide applications in many systems, such as for example, in a microprocessor for buffering and distributing a clock signal, or in a memory controller for proper timing of signals needed to read data from system memory. To save power, it is desirable to power down a phase locked loop or a delay locked loop when they are not needed. However, when powered up, these circuits need to acquire lock again to perform their function. Consequently, in many mobile products for which long battery life is important, it is desirable for phase locked loops and delay locked loops to quickly achieve lock.

DESCRIPTION OF EMBODIMENTS

Figure 1:
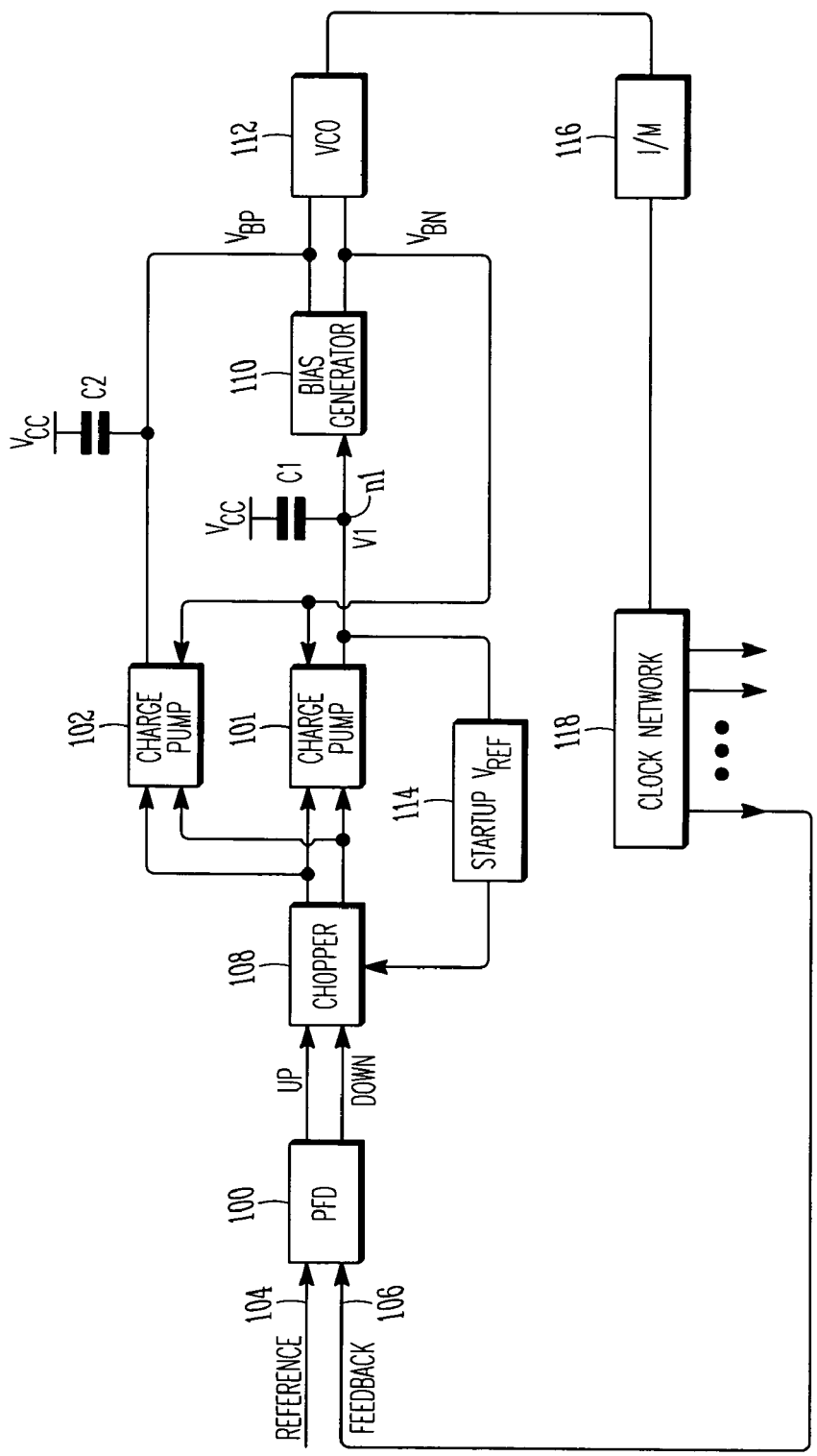
FIG. 1 illustrates a prior art self-biased phase locked loop.

Before describing the embodiments of the present invention, it is useful to first consider a prior art phase locked loop as illustrated in FIG. 1. The phase locked loop of FIG. 1 is a self-biasing phase locked loop and has been described in various publications, such as for example in "Low-Jitter Process-Independent DLL and PLL Based on Self-Biased Techniques," by John G. Maneatis, IEEE Journal of Solid-State Circuits, Vol. 31, No. 11, November 1996, pp. 1723-1732.

Referring to FIG. 1, module 100 is a phase frequency detector which provides an UP signal and a DN signal in response to a reference signal at input port 104 and a feedback signal at input port 106. Phase frequency detector module 100 is such that if the feedback signal lags the reference signal, then the UP signal will have wider pulses than that of the DN signal, and the UP signal will have a rising transition preceding the rising transition of the DN signal. Conversely, if the feedback signal leads the reference signal, then the DN signal will have wider pulses than that of the UP signal, and its upward transitions will precede that of the UP signal. These UP and DN signals are provided to a charge pump so that a capacitor is charged during those time intervals for which the UP signal has wider pulses than that of the DN signal, and the capacitor is discharged during those time intervals for which the DN signal has a wider pulses than that of the UP signal.

The voltage V1 at node n1 is the basic control voltage for the frequency of VCO (Voltage Controlled Oscillator) 112. For ease of discussion, we follow the convention that as the voltage V1 decreases, the frequency of VCO 112 increases, and similarly, as the voltage V1 increases, the frequency of VCO 112 decreases. Note that one terminal of capacitor C1 is at the supply voltage Vcc, and the other terminal is connected to node n1. Consequently, if the UP signal has wider pulses than that of the DN signal (the feedback signal lags the reference signal), then capacitor C1 is charged by bringing voltage V1 lower, which increases the frequency of VCO 112. Similarly, if the DN signal has wider pulses than that of the UP signal (the feedback signal leads the reference signal), then capacitor C1 is discharged by bringing voltage V1 higher, which decreases the frequency of VCO 112.

In the particular implementation of FIG. 1, there are two charge pumps, and chopper module 108 is employed before the UP and DN signals are provided to these charge pumps. Chopper module 108 limits the maximum width of the pulses in the UP and DN signals. Use of a chopper helps avoid VCO current starvation. When current starved, the tail currents for differential amplifiers used in a VCO are not sufficient, resulting in internal voltage swings that may not be full swings.

As discussed above, charge pump 101 charges or discharges capacitor C1 depending upon whether the pulses of the UP signal are wider or smaller than that of the DN signal. The resulting voltage on capacitor C1, denoted as V1, is provided to bias generator module 110. As discussed in the self-biased phase locked loop of Maneatis, bias generator module 110 outputs two bias voltages, denoted as Vbn and Vbp in FIG. 1. The voltage Vbn is a bias voltage provided to various nMOSFETs (n-Metal-Oxide-Semiconductor-Field-Effect-Transistor) within charge pumps 101 and 102, and the voltage Vbp is a bias voltage provided to various symmetric loads used in charge pump 102. These bias voltages also bias transistors within VCO 112.

VCO 112 is often implemented as a ring of connected differential amplifiers in which the tail currents of the differential amplifiers are controlled by the bias voltage Vbn, and the symmetric loads in the differential amplifiers are biased by the voltage Vbp. The bias voltage Vbp is also the voltage on capacitor C2. As discussed in the paper by Maneatis, proper design of charge pump 102 realizes a resistive load that would otherwise be placed in series with capacitor C1 so as to make the phase locked loop stable. The overall result is that the phase locked loop of FIG. 1 is self biasing in which the bias voltages, Vbn and Vbp, adjust themselves to provide low jitter in response to ground and power supply noise. Furthermore, by proper design of charge pump 102, the synthesized resistance is adaptive or self biasing in such a way that the dampening factor of the phase locked loop is kept approximately constant.

Suppose that the phase locked loop of FIG. 1 has been put into a sleep mode and it is now desired to start it up. When the phase locked loop is first enabled, the voltage V1 at node N1 is pulled down towards some reference voltage Vref by startup module 114. The reference voltage is chosen such that VCO 112 would be put into a so-called safe range if V1 were to be pulled down to Vref.

During the startup mode, charge pumps 101 and 102 are disabled and therefore are not controlling voltage V1 or voltage Vbp. Although during the startup mode phase frequency detector 100 is providing valid outputs in the form of the UP and DN signals, these signals are nevertheless ignored by the other modules in the phase locked loop. Once the voltage V1 reaches the reference voltage Vref determined by startup module 114, startup circuit 114 is disabled, and the phase locked loop is then out of its startup mode. Charge pumps 101 and 102 are then enabled to control the voltage V1 at node n1 and the voltage Vbp on capacitor C2. Over time, the phase locked loop of FIG. 1 eventually reaches its steady state mode of operation in which the phase of the feedback signal at input port 106 is adjusted by VCO 112 to match that of the reference signal provided at input port 104.

Also shown in FIG. 1 is the inclusion of divider module 116 and clock network 118. In this way, the reference clock provided by the reference signal at input 104 is buffered and multiplied by the phase locked loop, and distributed throughout clock network 118, where one of the signals in clock network 118 is the feedback signal which is fed back to the phase locked loop via input port 106.

Figure 2:
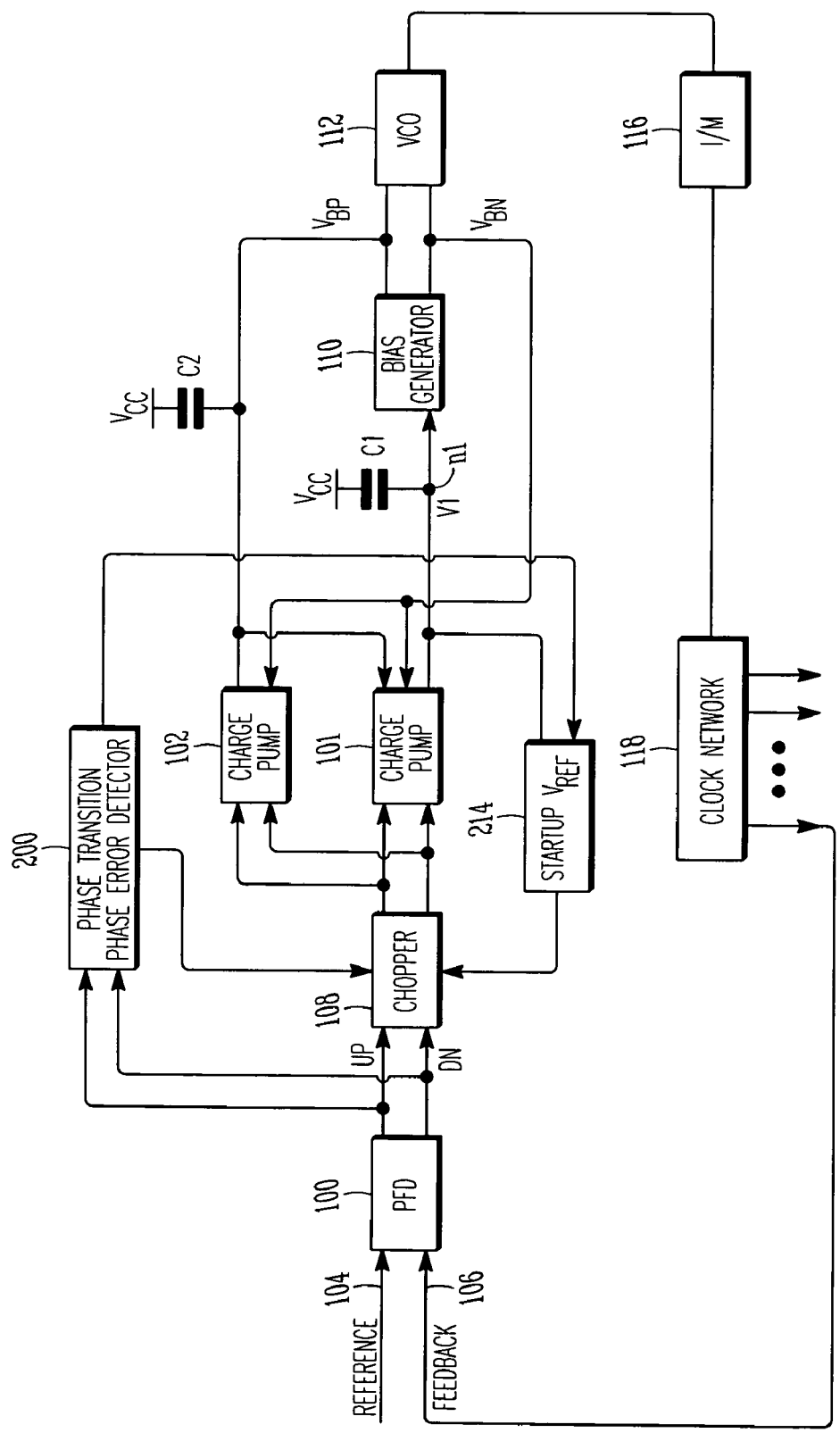
FIG. 2 illustrates a phase locked loop according to an embodiment of the present invention.

An embodiment of the present invention is illustrated in FIG. 2, where for ease of discussion, functional modules in FIG. 2 corresponding to functional modules in FIG. 1 are correspondingly labeled. An important distinction between the circuit of FIG. 2 and FIG. 1 is that of a new detector module labeled as module 200 in FIG. 2. This module may be termed a phase transition and phase error detector. Its input signals are the UP signal and the DN signal provided by phase frequency detector 100. Phase transition and phase error detector 200 provides control signals to chopper module 108 and startup circuit 214. The way in which the circuit of FIG. 2 operates in a startup mode is very different from that of FIG. 1, and is now discussed.

Detector module 200 comprises two components, a sub-circuit to detect whether there has been a phase transition, and another sub-circuit to detect the phase error inherent to the UP and DN signals. By a phase transition, it is meant a change in the relative pulse widths of the UP and DN signals. When the phase locked loop of FIG. 2 is first put into a startup mode, detector 200 and startup circuit module 214 are enabled, and startup circuit module 214 starts pulling down the voltage V1 at node n1 towards a reference voltage, denoted as Vref in FIG. 2. However, startup module 214 in FIG. 2 is different from startup module 114 in FIG. 1. Whereas startup module 114 does not reset itself until the voltage V1 has been lowered to the reference voltage Vref, startup circuit module 214 is controlled by detector module 200, and the voltage V1 is not necessarily pulled all the way down to Vref. In practice, as will be apparent from the discussion below, startup circuit 214 will most likely be disabled without the voltage V1 being pulled all the way down to Vref. In some embodiments, the reference voltage may be chosen low enough so that it provides a failsafe backup, and such that if V1 were to equal Vref, then VCO 112 would still be functional and well above the frequency at which there is lock.

For the particular embodiment of FIG. 2, initially during a startup mode, the UP signal provided by phase frequency detector 100 has wider pulses than that of the DN signal. A phase transition occurs when the UP and DN signals provided by phase frequency detector 100 switch from the condition in which the UP signal pulses are wider than that of the DN signals to the condition in which the DN signal pulses are wider than that of the UP signal. This phase transition occurs when the frequency of the feedback signal on input port 106, provided by the feedback loop of VCO 112 and divider 116, passes through the frequency of the reference signal provided at input port 104. When this phase transition is detected, a control signal is provided to startup circuit 214 so that it is now disabled and no longer pulling down node n1. Also, upon detecting a phase transition, detector 200 provides a control signal to enable chopper module 108. Charge pump module 101 is also enabled when chopper module 108 is enabled. During this transition, chopper 108 may be tuned so as to provide a larger maximum pulse width for the UP and DN signals passed to the charge pumps than it does when the phase locked loop is operating in its steady state condition.

Continuing with the above discussion of the startup mode, once charge pump module 101 is enabled, it drives the VCO frequency towards the lock frequency. For the embodiment of FIG. 2, during this period of time, charge pump 102 has not yet been enabled. This helps prevent VCO current starvation. The phase error sub-circuit of detector 200 now comes into play. It monitors the phase difference between the reference signal at input port 104 and the feedback signal at input port 106. By observing the UP and DN signals provided by phase frequency detector 100, when the phase difference between the reference signal and the feedback signal falls within some predetermined range, a control signal is provided to chopper 108 so that charge pump 102 is enabled. Chopper 108 is operating in the steady state condition so that its maximum pulse widths are tuned to the normal operating values. Detector circuit 200 is also disabled until the next startup sequence.

At this point, the startup mode has completed, and both charge pumps are enabled so the various voltages, such as V1, Vbp, and Vbn, are driven to their steady state values. Eventually, the phase locked loop will lock onto the frequency of the reference signal. Note that, unlike the circuit of FIG. 1, during the startup mode, the UP and DN signals provided to phase frequency detector 100 are not ignored but are monitored by detector 200 so that when a phase transition is detected, charge pump 101 is enabled and startup circuit 114 is disabled so that it no longer is pulling down the voltage at node n1. With these features, it is expected that the embodiments of FIG. 2 will achieve lock faster than the circuit of FIG. 1. Furthermore, because charge pump 102 is not enabled until the phase error sub-circuit of module 200 detects that the phase difference between the reference and feedback signals fall within a predetermined range, it is expected that in the embodiments of FIG. 2, VCO 112 will not be current starved.

Figure 3:
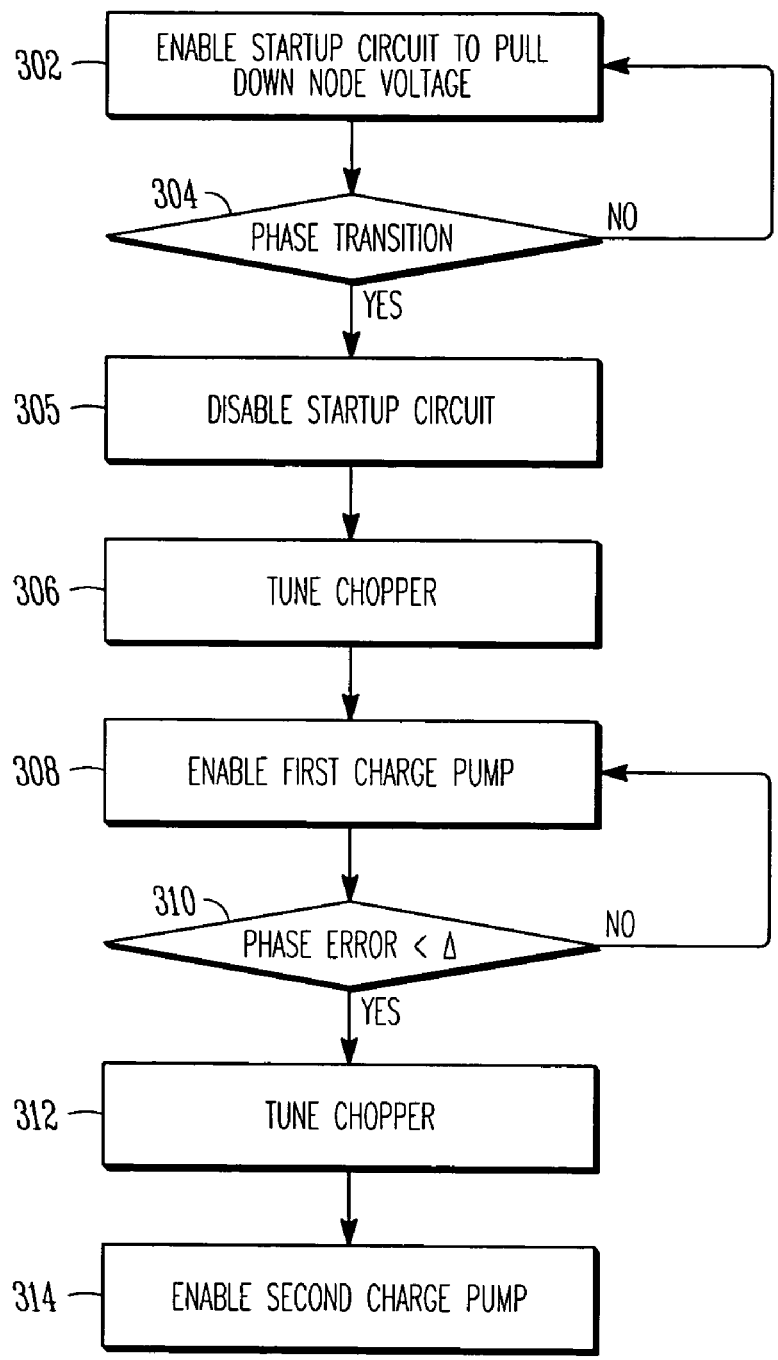
FIG. 3 is a flow diagram illustrating the startup mode for the embodiment of FIG. 2.

The above startup mode process may be summarized by the flow diagram of FIG. 3. When the phase locked loop of FIG. 2 is brought out of a sleep mode into a startup mode, module 302 indicates that startup circuit 214 is enabled and pulls down the voltage at node n1. It pulls the voltage V1 towards a reference voltage Vref, but in practice it will likely be disabled before the voltage V1 falls to Vref. The voltage V1 at n1 may be pulled down with a leaker device, such as a nMOS-FET, where for some embodiments the size of the leaker may be made as strong as possible within any bandwidth constraints the of the phase locked loop. In practical applications, the resulting discharge rate of capacitor C1 should be balanced across process, voltage, and temperature variations (corners) to avoid excessive frequency overshoot. The reference voltage Vref may be used as a failsafe backup, where its level is set for a safe maximum frequency at which feedback dividers 116 are functional. During this initial phase of the start mode in module 302, both charge pumps are disabled, as well as the chopper.

The UP and DN signals from the phase frequency detector are still valid and are monitored by a phase transition detector indicated in module 304. As long as there is no phase transition detected by module 304, the process indicated by module 302 is still ongoing. However, when a phase transition is detected, we see from the flow diagram of FIG. 3 that control is brought to module 305 so that the startup circuit is disabled. Furthermore, in module 306, the chopper module is tuned, and as indicated in module 308, the first charge pump is enabled. The first charge pump may be identified as charge pump module 101 in FIG. 2, which provides the main control voltage V1 to bias generator 110.

After the first charge pump is enabled by module 308, control is brought to module 310, where the phase error between the reference signal and the feedback signal is monitored via the UP and DN signals. As long as this phase error is greater than some predetermined threshold indicated by Δ, the process indicated by module 308 continues, but when the phase error is detected as being less than Δ, then control is brought to module 312 where the chopper is tuned to its steady state operation. Then, in module 314 the second charge pump is enabled. At this point, the startup mode is now complete and the phase locked loop is operating in its normal steady state mode.

Figure 4:
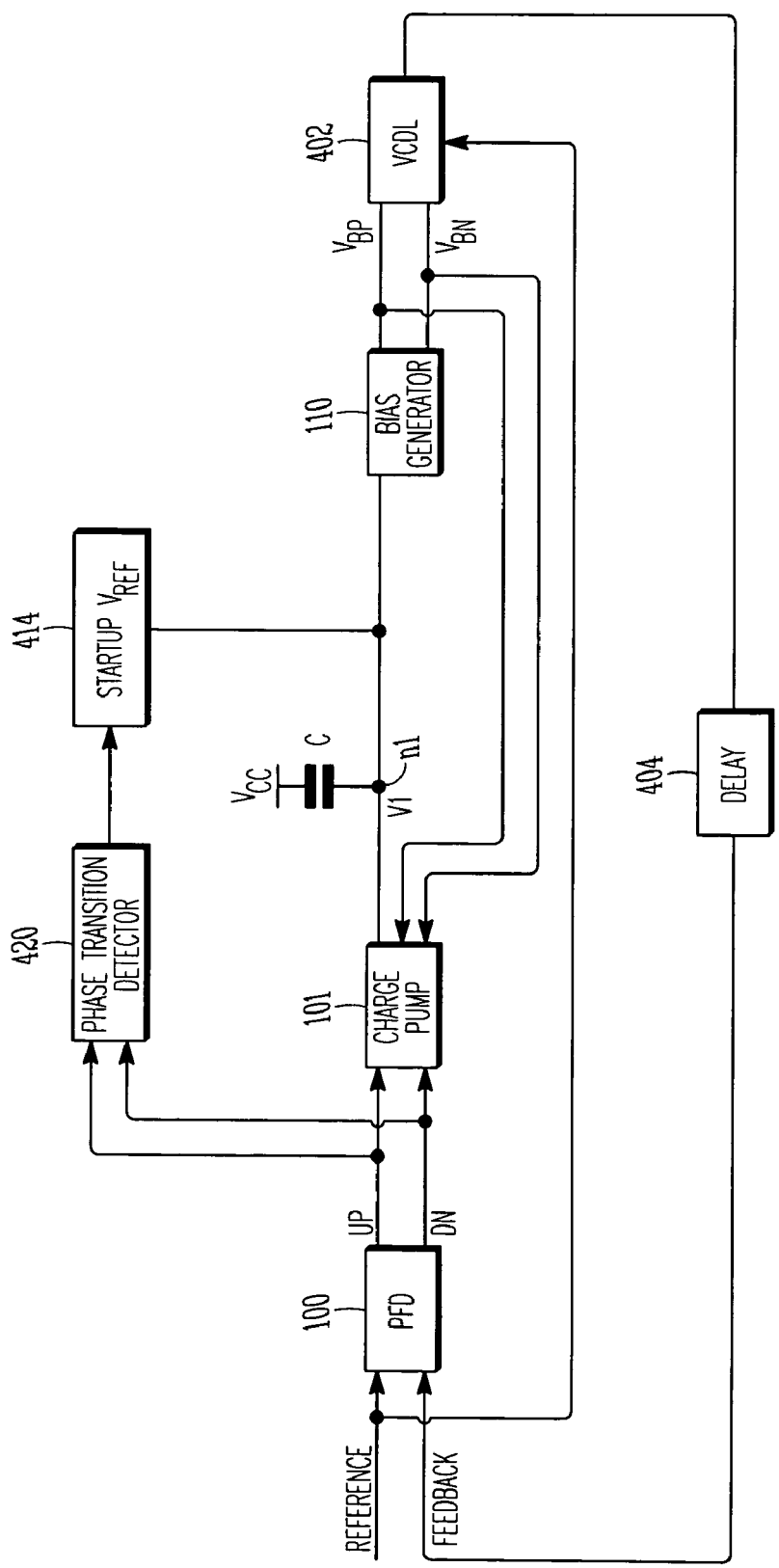
FIG. 4 illustrates a delay locked loop according to an embodiment of the present invention.

Embodiments of the present invention also may find applications to delay locked loops. An example of a delay locked loop embodiment is illustrated in FIG. 4, where again, modules in FIG. 4 corresponding to modules in the previous figures are correspondingly labeled. In the example of FIG. 4, a voltage controlled delay line (VCDL), denoted as VCLD 402, provides a clock signal that is delayed by delay module 404, and the resulting delayed clock signal is the feedback signal provided at input port 106. In this way, when the delay locked loop of FIG. 4 has achieved steady state, the clock signal provided by voltage controlled delay line 402 is shifted relative to the reference clock provided at input port 104. Such a shifted signal may be used in various timing schemes, such as reading data from system memory.

For ease of discussion, we follow the convention that as the voltage V1 at node n1 increases, the delay provided by VCDL 402 increases. Similarly, as the voltage V1 at node n1 decreases, the delay provided by VCDL 402 decreases.

In FIG. 4, there is only one charge pump denoted as module 101. A second charge pump is not required because there is no need to synthesize a resistor in series with capacitor C in FIG. 4 for stability. Module 420 in FIG. 4 is a phase transition detector which may be equivalent or similar to the phase transition detector component of detector module 200 in FIG. 2.

In the particular embodiment of FIG. 4, the circuits are designed so that initially, the DN signal provided by phase frequency detector 100 has wider pulses than that of the UP signal, and phase transition detector 420 detects a phase transition when this relationship between the UP and DN signals changes. In the particular embodiment of FIG. 4, when the delay locked loop is first put into a startup mode after being woken up from a sleep mode, startup circuit 414 pulls up node n1 towards some reference voltage Vref. This reference voltage may be set to the supply voltage Vcc.

Note that in the beginning of a startup mode, for the example of FIG. 4, the DN signal has wider pulses than that of the UP signal, and startup circuit 414 is enabled to pull up node n1, but that in the example of FIG. 2, at the beginning of a startup mode the UP signal has wider pulses than that of the DN signal, and startup circuit 214 pulls down node n1. These conventions were only chosen for convenience. In other embodiments, the various circuits in a delay locked loop may be chosen so that at the beginning of a startup mode, the previous conventions are reversed. That is, embodiment delay lock loops may be realized so that at the beginning of a startup mode, the UP signal has wider pulses than that of the DN signal, and the startup circuit is enabled to pull down node n1. Similarly, embodiment phase lock loops may be realized so that at the beginning of a startup mode, the UP signal has smaller pulses than that of the DN signal, and the startup circuit is enabled to pull up node n1.

Continuing with the description of the embodiment of FIG. 4, before a phase transition is detected by detector 420, for some embodiments, charge pump 101 may be disabled and for other embodiments, it may be enabled. However, similar to the embodiment of FIG. 2, when a phase transition is detected, startup circuit 414 is disabled and if charge pump 101 has not yet been enabled, it is then enabled upon a phase transition detection. Thereafter, once the phase transition has been detected, the delay locked loop of FIG. 4 operates as it normally would in steady state operation.

Figure 5:
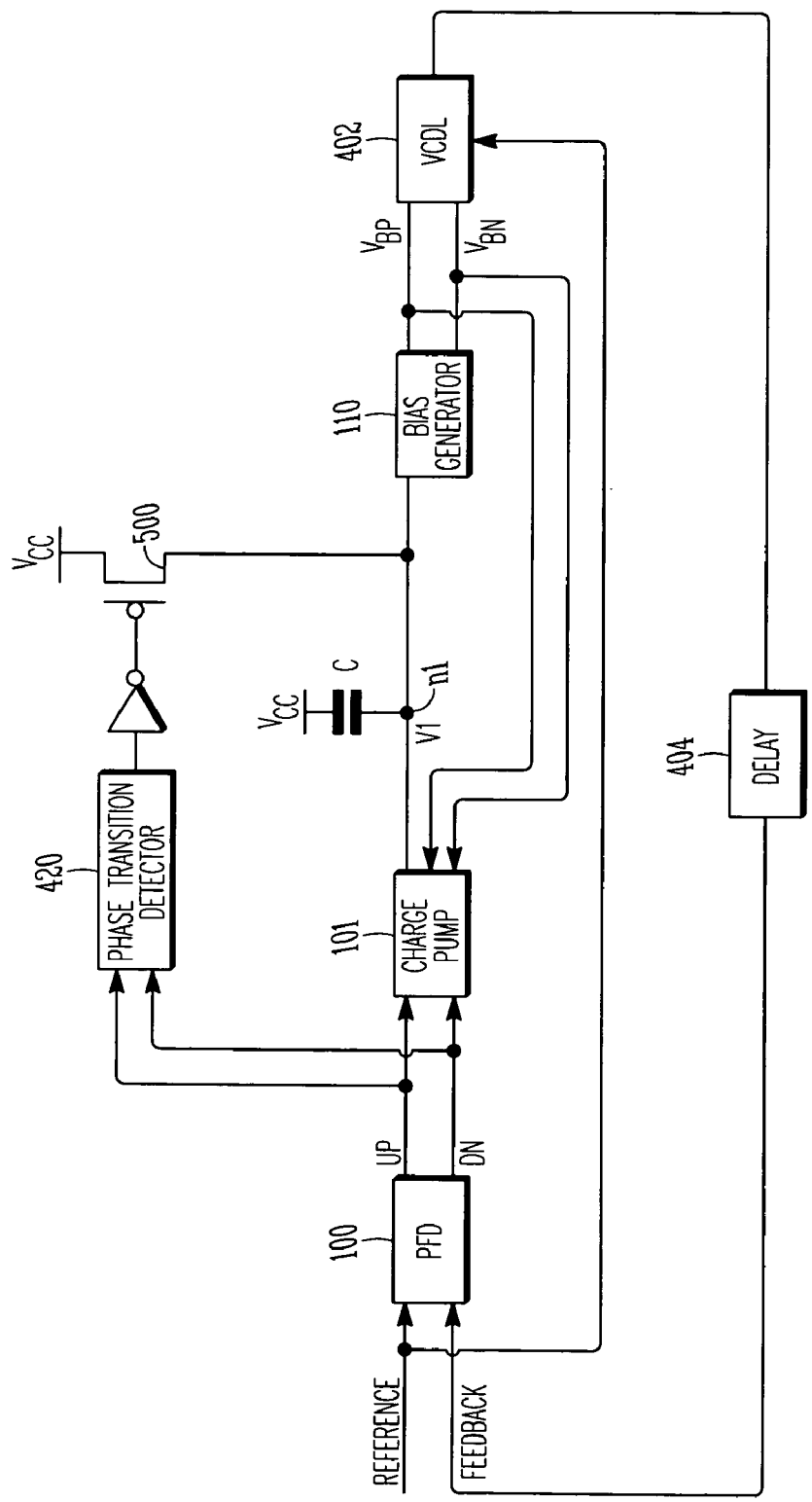
FIG. 5 illustrates another delay locked loop according to an embodiment of the present invention.

Startup circuit 414 may be realized in some embodiments as a simple current pumping pMOSFET. This is illustrated in FIG. 5. When the gate of pMOSFET 500 is driven LOW, pMOSFET 500 pulls node N1 towards supply voltage Vcc. During startup mode, pMOSFET 500 is discharging capacitor C, and charge pump 101 is also discharging capacitor C if it has not been disabled during startup. In other embodiments, two or more pMOSFETs may be used in parallel to provide a function similar to that of pMOSFET 500, but where the various paralleled pMOSFETs are turned OFF successively so that there is less of a voltage overshoot on node n1. These pMOSFETs could be controlled by a finite state machine, or in other embodiments, may be controlled by the UP and DN signals provided by frequency phase detector 100.

Figure 6:
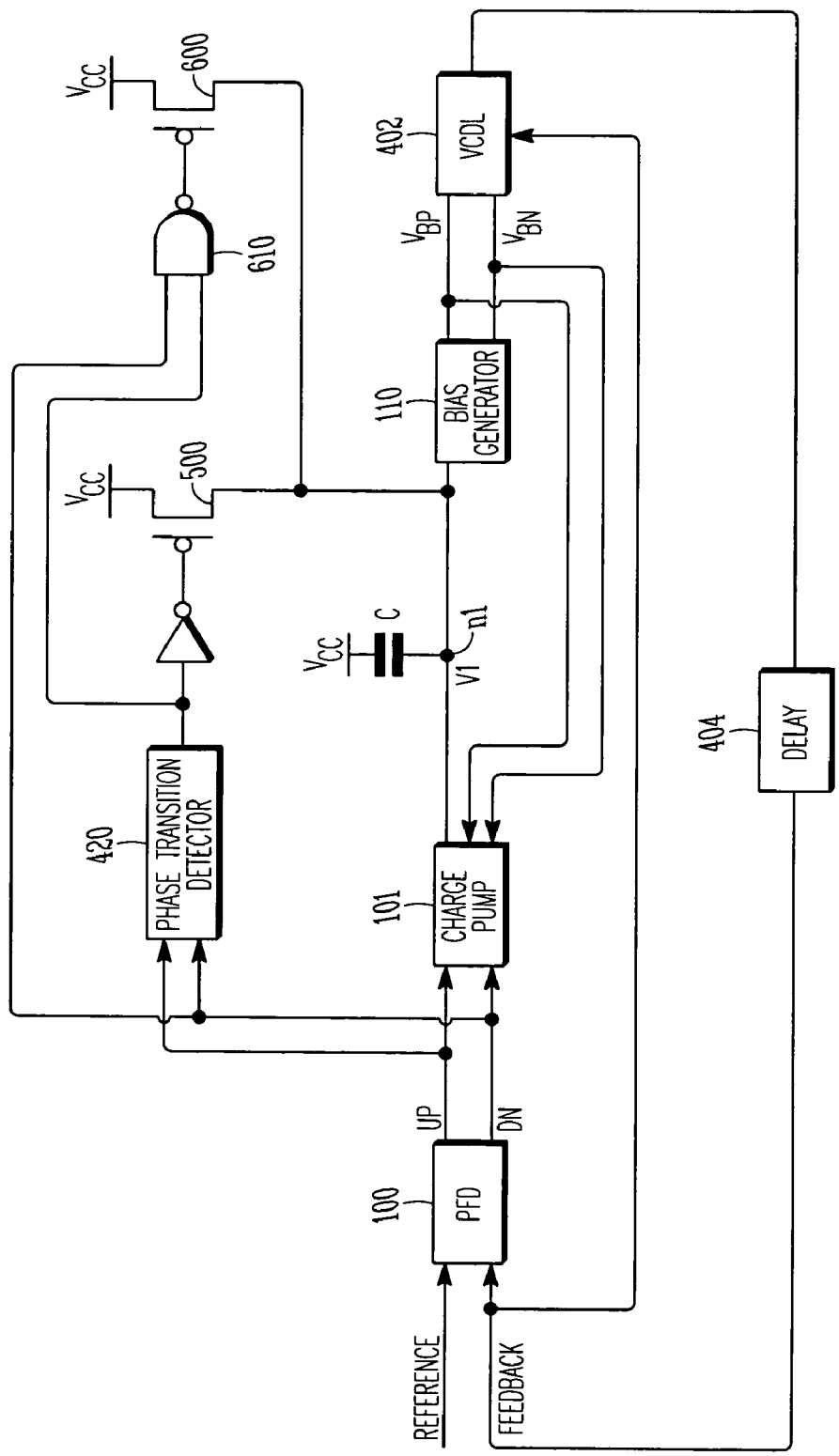
FIG. 6 illustrates yet another delay locked loop according to an embodiment of the present invention.

For example, in FIG. 6, pMOSFET 600 is added to also pull up node n1. Its gate is responsive to the DN signal provided by phase frequency detector 100. Remembering now that in the particular example of FIG. 6, during startup mode, initially the DN signal has wider pulses than that of the UP signal, and remembering that the pulses of the DN signal will decrease in width as the voltage at node n1 is brought up to the lock voltage, it is seen that the charging of capacitor C by pMOSFET 600 decreases as the pulses of the DN signal decrease as the voltage at node n1 moves upward toward the lock voltage. The NAND gate 610 driving the gate of pMOSFET 600 is controlled by detector 420 so that when detector 420 detects the phase transition, the pull up action of pMOSFET 600 is disabled for steady state operation.

Figure 7:
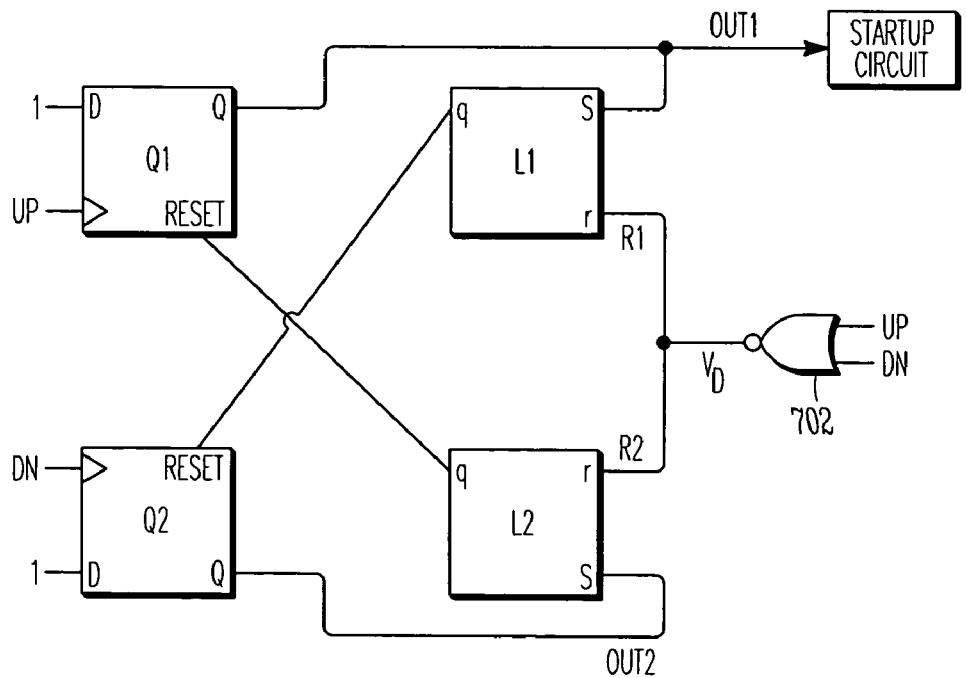
FIG. 7 illustrates a startup circuit for use in the embodiment of FIG. 4.

An example of a phase transition detector is illustrated in FIG. 7. Depending upon which rising edge of the UP or DN signal comes first, either the output labeled OUT1 or the output labeled OUT2 is set HIGH first by the D flip-flops Q1 and Q2. If OUT1 is set HIGH first, then it sets the asynchronous reset signal of flip-flop Q2 to HIGH through set-reset latch L1, whereas if OUT2 is set HIGH first, then it sets the asynchronous reset signal of flip-flop Q1 to HIGH through set-reset latch L2. When both the UP and DN signals go LOW after the falling edge of the reference and feedback signal, the output of NOR gate 702 goes HIGH and resets the R1 and R2 signals to LOW. OUT1 goes LOW when the falling edge of the DN signal occurs before the falling edge of the UP signal, which signifies that there has been an overshoot of the final operating point voltage at node n1 of FIG. 5.

Figure 8:
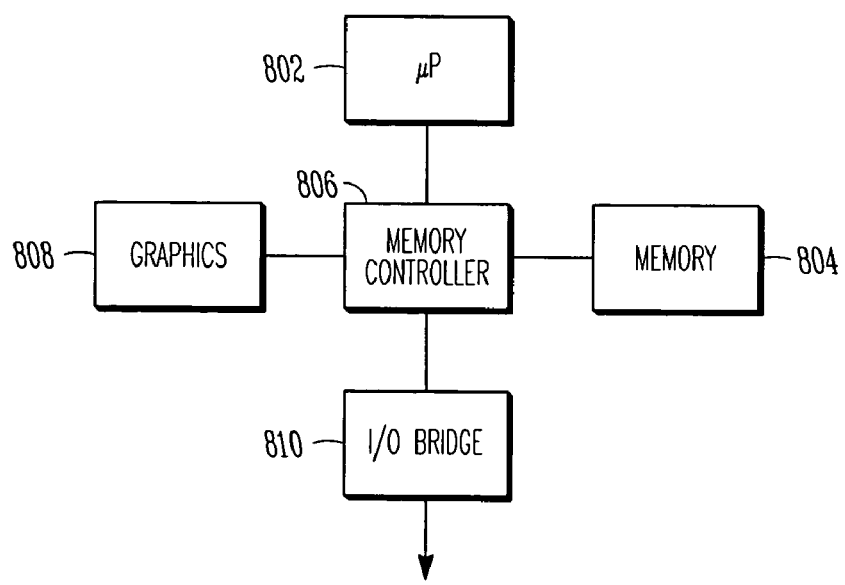
FIG. 8 is a simplified system diagram of a computer system employing an embodiment of the present invention.

Embodiments of the present invention are expected to find wide applications in many systems. One particular example is in the memory controller (chipset) of a computer system. Referring to FIG. 8, microprocessor 802 communicates to system memory 804 by way of memory controller 806. Memory controller 806 may also provide an interface to graphics module 808, as well as to I/O (Input/Output) bridge 810. Other components may be connected to I/O bridge 810, but are not shown for simplicity. Furthermore, not all components of a computer system are necessarily shown in FIG. 8. Memory controller 806 may form part of the so-called chipset in a computer system. Embodiments of the present invention may also find applications in microprocessor 802, as well as other components in the computer system of FIG. 8.

Various modifications may be made to the disclosed embodiments without departing from the scope of the invention as claimed below.

It is to be understood in these letters patent that the meaning of "A is connected to B", where A or B may be, for example, a node or device terminal, is that A and B are connected to each other so that the voltage potentials of A and B are substantially equal to each other. For example, A and B may be connected by way of an interconnect, for example. In integrated circuit technology, the interconnect may be exceedingly short, comparable to the device dimension itself. For example, the gates of two transistors may be connected to each other by polysilicon or copper interconnect that is comparable to the gate length of the transistors. As another example, A and B may be connected to each other by a switch, such as a transmission gate, so that their respective voltage potentials are substantially equal to each other when the switch is ON.

It is also to be understood in these letters patent that the meaning of "A is coupled to B" is that either A and B are connected to each other as described above, or that, although A and B may not be connected to each other as described above, there is nevertheless a device or circuit that is connected to both A and B. This device or circuit may include active or passive circuit elements, where the passive circuit elements may be distributed or lumped-parameter in nature. For example, A may be connected to a circuit element which in turn is connected to B.

It is also to be understood in these letters patent that various circuit blocks, such as current mirrors, amplifiers, etc., may include switches so as to be switched in or out of a larger circuit, and yet such circuit blocks may still be considered connected to the larger circuit because the various switches may be considered as included in the circuit block.

Various mathematical relationships may be used to describe relationships among one or more quantities. For example, a mathematical relationship or mathematical transformation may express a relationship by which a quantity is derived from one or more other quantities by way of various mathematical operations, such as addition, subtraction, multiplication, division, etc. Or, a mathematical relationship may indicate that a quantity is larger, smaller, or equal to another quantity. These relationships and transformations are in practice not satisfied exactly, and should therefore be interpreted as "designed for" relationships and transformations. One of ordinary skill in the art may design various working embodiments to satisfy various mathematical relationships or transformations, but these relationships or transformations can only be met within the tolerances of the technology available to the practitioner.

Accordingly, in the following claims, it is to be understood that claimed mathematical relationships or transformations can in practice only be met within the tolerances or precision of the technology available to the practitioner, and that the scope of the claimed subject matter includes those embodiments that substantially satisfy the mathematical relationships or transformations so claimed.

What is claimed is:

1. An apparatus comprising:
   a phase detector to provide a first signal having pulses and a second signal having pulses, where the first and second signals are indicative of the phase difference between a reference signal and a feedback signal;
   a capacitor;
   a start-up circuit to charge or discharge the capacitor when enabled; and
   a phase transition detector to disable the start-up circuit in response to detecting a phase transition, wherein the phase transition detector is to receive both the first and second signals provided by the phase detector before the phase transition is detected, and wherein the pulses of the first signal are wider than the pulses of the second signal before the phase transition and are smaller than the pulses of the second signal after the phase transition.

2. The apparatus as set forth in claim 1, the reference signal having a frequency and the feedback signal having a frequency, wherein the pulses of the first signal are wider than the pulses of the second signal when the frequency of the feedback signal is less than the frequency of the reference signal.

3. The apparatus as set forth in claim 1, wherein the start-up circuit charges the capacitor when enabled.

4. The apparatus as set forth in claim 1, wherein the start-up circuit comprises a transistor to provide a low impedance path from the capacitor to a voltage rail when the transistor is ON.

5. The apparatus as set forth in claim 1, further comprising:
   a charge pump to charge or discharge the capacitor in response to the first and second signals when enabled, wherein the charge pump is enabled when a phase transition is detected.

6. The apparatus as set forth in claim 5, further comprising:
   a chopper, wherein the chopper is enabled when the phase transition is detected so as to limit the pulses of the first and second signals to not exceed a first maximum pulse width to provide a first chopped signal and a second chopped signal; and
   wherein the charge pump charges or discharges the capacitor in response to the first and second chopped signals when enabled.

7. The apparatus as set forth in claim 6, further comprising:
   a phase error detector, the phase error detector to tune the chopper to limit the pulses of the first and second signals to not exceed a second maximum pulse width when the phase difference between the reference signal and the feedback signal is detected by the phase error detector to be less than a pre-determined value, wherein the second maximum pulse width is less than the first maximum pulse width.

8. The apparatus as set forth in claim 5, further comprising:
   a second capacitor;
   a second charge pump to charge or discharge the second capacitor in response to the first and second signals when enabled; and
   a phase error detector to enable the second charge pump when the phase error detector detects that the phase difference between the reference signal and the feedback signal is less than a pre-determined value.

9. The apparatus as set forth in claim 8, further comprising:
   a chopper, wherein the chopper is enabled when the phase transition is detected so as to limit the pulses of the first and second signals to not exceed a first maximum pulse width to provide a first chopped signal and a second chopped signal; and
   wherein the charge pump charges or discharges the capacitor in response to the first and second chopped signals when enabled.

10. The apparatus as set forth in claim 9, the phase error detector to tune the chopper to limit the pulses of the first and second signals to not exceed a second maximum pulse width when the phase difference between the reference signal and the feedback signal is detected by the phase error detector to be less than a pre-determined value, wherein the second maximum pulse width is less than the first maximum pulse width.

11. The apparatus as set forth in claim 1, further comprising a voltage controlled delay line to provide an output signal to provide the feedback signal.

12. The apparatus as set forth in claim 1, further comprising a voltage controlled oscillator to provide an output signal indicative of the feedback signal.

13. A method comprising:
comparing a reference signal to a feedback signal to provide a first signal and a second signal indicative of the phase difference between the reference signal and the feedback signal, wherein the first signal and the second signal have pulses such that the first signal pulses have wider widths than that of the second signal pulses when the phase difference between the reference signal and the feedback signal has a first algebraic sign and the first signal pulses are less than the second signal pulses when the phase difference between the reference signal and the feedback signal has a second algebraic sign opposite to that of the first algebraic sign;
providing a low impedance path from a node to a source having a reference voltage to charge or discharge a capacitor;
receiving both the first and second signals after the reference and feedback signals are compared;
detecting a phase transition based on the first and second signals; and
removing the low impedance path when the phase transition in the first and second signals is detected, wherein the pulses of the first signal and the pulses of the second signal satisfy a first ordered relationship before the phase transition occurs and satisfies a second ordered relationship after the phase transition occurs.

14. The method as set forth in claim 13, wherein the first and second signals satisfy the first ordered relationship if and only if the pulses of the first signal are longer in duration than the pulses of the second signal.

15. The method as set forth in claim 13, further comprising:
enabling a charge pump circuit to charge or discharge the capacitor in response to the first signal and the second signal when a phase transition is detected.

16. The method as set forth in claim 15, further comprising:
tuning a chopper when the phase transition is detected so as to limit the pulses of the first and second signals to not exceed a first maximum pulse width to provide a first chopped signal and a second chopped signal, wherein the charge pump charges or discharges the capacitor in response to the first and second chopped signals when enabled.

17. The method as set forth in claim 15, further comprising:
enabling a second charge pump circuit to charge or discharge a second capacitor in response to the first signal and the second signal when the magnitude of the phase difference between the reference signal and the feedback signal is detected to be less than a pre-assigned value.

18. The method as set forth in claim 17, further comprising:
tuning a chopper to limit the pulses of the first and second signals to not exceed a second maximum pulse width when the phase difference between the reference signal and the feedback signal is detected to be less than a pre-determined value, wherein the second maximum pulse width is less than the a maximum pulse width.

19. A computer system comprising:
a processor;
memory; and
a memory controller coupled to the processor to access the memory, the memory controller comprising:
a phase detector to provide a first signal having pulses and a second signal having pulses, wherein the first and second signals are indicative of the phase difference between a reference signal and a feedback signal;
a capacitor;
a start-up circuit to charge or discharge the capacitor when enabled; and
a phase transition detector to disable the start-up circuit in response to detecting a phase transition, wherein the phase transition detector is to receive both the first and second signals provided by the phase detector before the phase transition is detected, and wherein the pulses of the first signal are wider than the pulses of the second signal before the phase transition and are smaller than the pulses of the second signal after the phase transition.

20. The computer system as set forth in claim 19, the reference signal having a frequency and the feedback signal having a frequency, wherein the pulses of the first signal are wider than the pulses of the second signal when the frequency of the feedback signal is less than the frequency of the reference signal.

21. The computer system as set forth in claim 19, wherein the start-up circuit charges the capacitor when enabled.

22. The computer system as set forth in claim 19, wherein the start-up circuit comprises a transistor to provide a low impedance path from the capacitor to a voltage rail when the transistor is ON.

23. The computer system as set forth in claim 19, the memory controller further comprising:
a charge pump to charge or discharge the capacitor in response to the first and second signals when enabled, wherein the charge pump is enabled when a phase transition is detected.

24. The computer system as set forth in claim 23, the memory controller further comprising:
a chopper, wherein the chopper is enabled when the phase transition is detected so as to limit the pulses of the first and second signals to not exceed a first maximum pulse width to provide a first chopped signal and a second chopped signal; and
wherein the charge pump charges or discharges the capacitor in response to the first and second chopped signals when enabled.

25. The apparatus as set forth in claim 24, further comprising:
a phase error detector, the phase error detector to tune the chopper to limit the pulses of the first and second signals to not exceed a second maximum pulse width when the phase difference between the reference signal and the feedback signal is detected by the phase error detector to be less than a pre-determined value, wherein the second maximum pulse width is less than the first maximum pulse width.

26. The computer system as set forth in claim 23, the memory controller further comprising:
a second capacitor;
a second charge pump to charge or discharge the second capacitor in response to the first and second signals when enabled; and
a phase error detector to enable the second charge pump when the phase error detector detects that the phase difference between the reference signal and the feedback signal is less than a pre-determined value.

27. The computer system as set forth in claim 26, the memory controller further comprising:
- a chopper, wherein the chopper is enabled when the phase transition is detected so as to limit the pulses of the first and second signals to not exceed a first maximum pulse width to provide a first chopped signal and a second chopped signal; and
- wherein the charge pump charges or discharges the capacitor in response to the first and second chopped signals when enabled.

28. The apparatus as set forth in claim 27, the phase error detector to tune the chopper to limit the pulses of the first and second signals to not exceed a second maximum pulse width when the phase difference between the reference signal and the feedback signal is detected by the phase error detector to be less than a pre-determined value, wherein the second maximum pulse width is less than the first maximum pulse width.

* * * * *